(12) United States Patent
Kim

(10) Patent No.: US 12,400,895 B2
(45) Date of Patent: Aug. 26, 2025

(54) TRANSFER CONVEYOR SYSTEM FOR SEMICONDUCTOR INSPECTING APPARATUS USING MOVING MAGNET

(71) Applicant: ZEUS TECH CO., LTD., Gangwon-do (KR)

(72) Inventor: Hong Youn Kim, Gangwon-do (KR)

(73) Assignee: ZEUS TECH CO., LTD., Gangwon-do (KR)

( * ) Notice: Subject to any disclaimer, the term of this patent is extended or adjusted under 35 U.S.C. 154(b) by 717 days.

(21) Appl. No.: 17/592,536

(22) Filed: Feb. 4, 2022

(65) Prior Publication Data

US 2023/0230866 A1 Jul. 20, 2023

(30) Foreign Application Priority Data

Jan. 6, 2022 (KR) .................. 10-2022-0002372

(51) Int. Cl.
| | |
|---|---|
| H01L 21/677 | (2006.01) |
| B65G 54/02 | (2006.01) |
| H01F 7/16 | (2006.01) |
| H01L 21/67 | (2006.01) |
| H01L 21/68 | (2006.01) |
| B65G 43/08 | (2006.01) |
| B65G 49/06 | (2006.01) |

(52) U.S. Cl.
CPC ........ *H01L 21/67763* (2013.01); *B65G 54/02* (2013.01); *H01F 7/1646* (2013.01); *H01L 21/67259* (2013.01); *H01L 21/67265* (2013.01); *H01L 21/67288* (2013.01); *H01L 21/677* (2013.01); *H01L 21/67709* (2013.01); *H01L 21/68* (2013.01); *B65G 2203/0283* (2013.01); *B65G 2203/042* (2013.01); *H01F 2007/1684* (2013.01)

(58) Field of Classification Search
CPC ......... H01L 21/67763; H01L 21/67265; H01F 7/1646; H01F 2007/1684
See application file for complete search history.

(56) References Cited

U.S. PATENT DOCUMENTS

| | | | |
|---|---|---|---|
| RE39,747 E * | 7/2007 | Peltier ...................... | G01D 5/36 318/135 |
| 10,520,103 B1 * | 12/2019 | Fatehi ...................... | F16K 17/36 |
| 2013/0325179 A1 * | 12/2013 | Liao ........................ | B25J 9/1697 700/254 |

* cited by examiner

*Primary Examiner* — Ernesto A Suarez
*Assistant Examiner* — Laurence R Brothers
(74) *Attorney, Agent, or Firm* — Revolution IP, PLLC

(57) ABSTRACT

A transfer conveyor system for a semiconductor inspecting apparatus using a moving magnet includes a carrier in which a semiconductor wafer or a substrate is seated and accommodated and which is transferred, an armature which is provided to be accommodated in a permanent magnet plate under the carrier, a stator which is disposed to be spaced apart from the armature, is fixedly installed on a guide rail, a sensor unit which is installed at each of two ends of each motor coil, detects whether the armature approaches, senses a variation of the magnetic field, and measures a position of the armature from speed information of the armature, and a carrier monitoring unit which is provided on the carrier and monitors the carrier to detect an abrasion degree, a damage state, or an alignment/misalignment of the carrier in real time.

8 Claims, 7 Drawing Sheets

FIG. 3
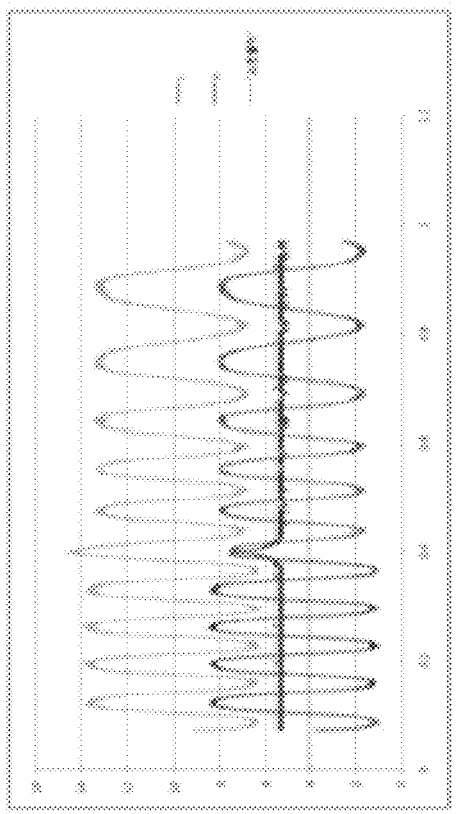
<Hall Sensor Signal (Oscilloscope Result)>
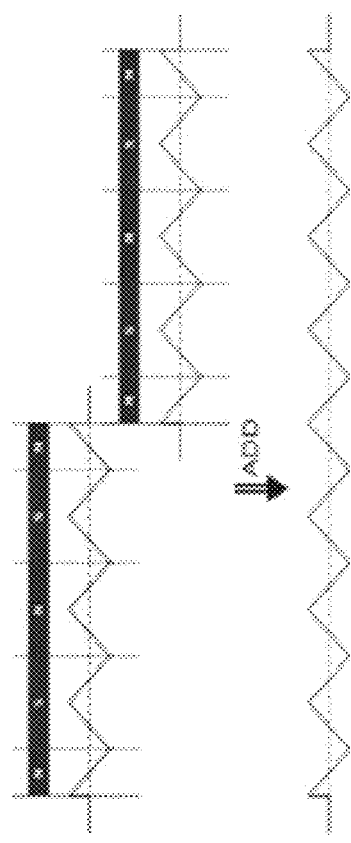
<Linear Hall Sensor Signal(sin/cos or AB)>

FIG. 7
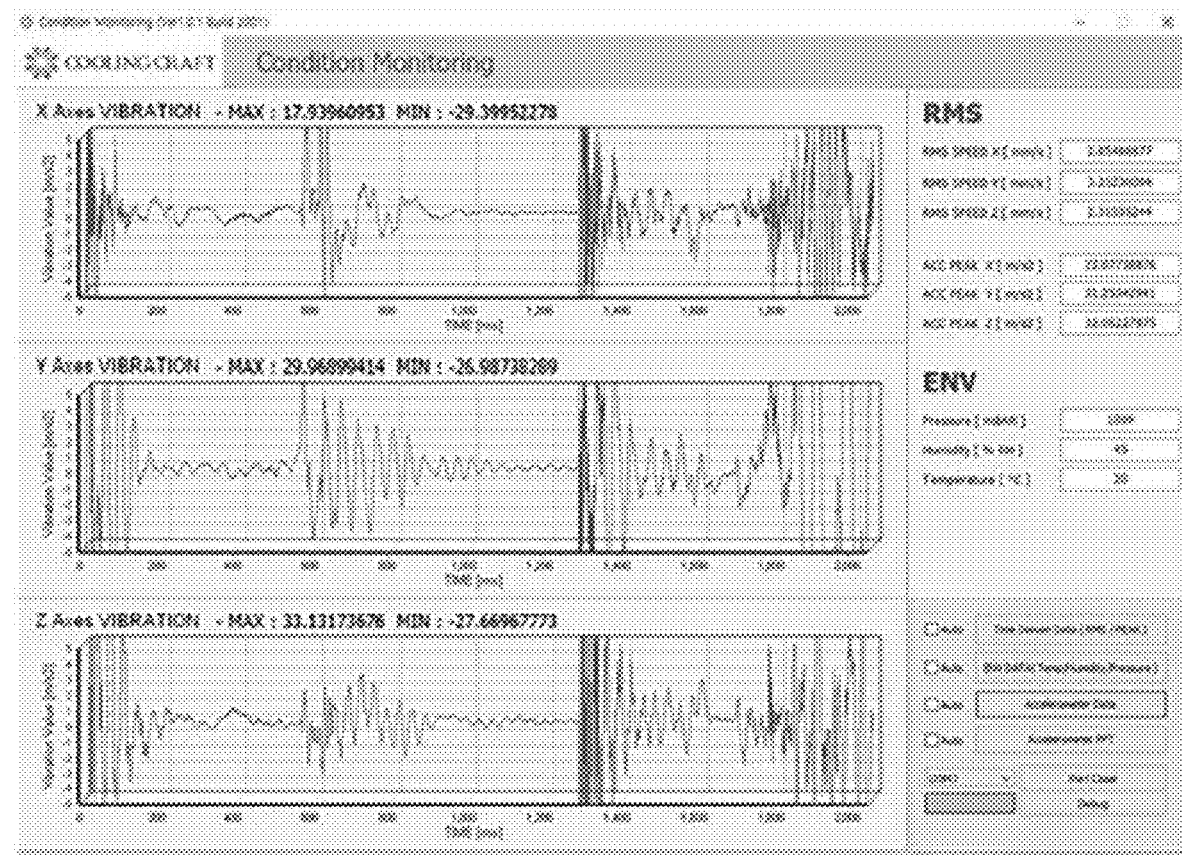
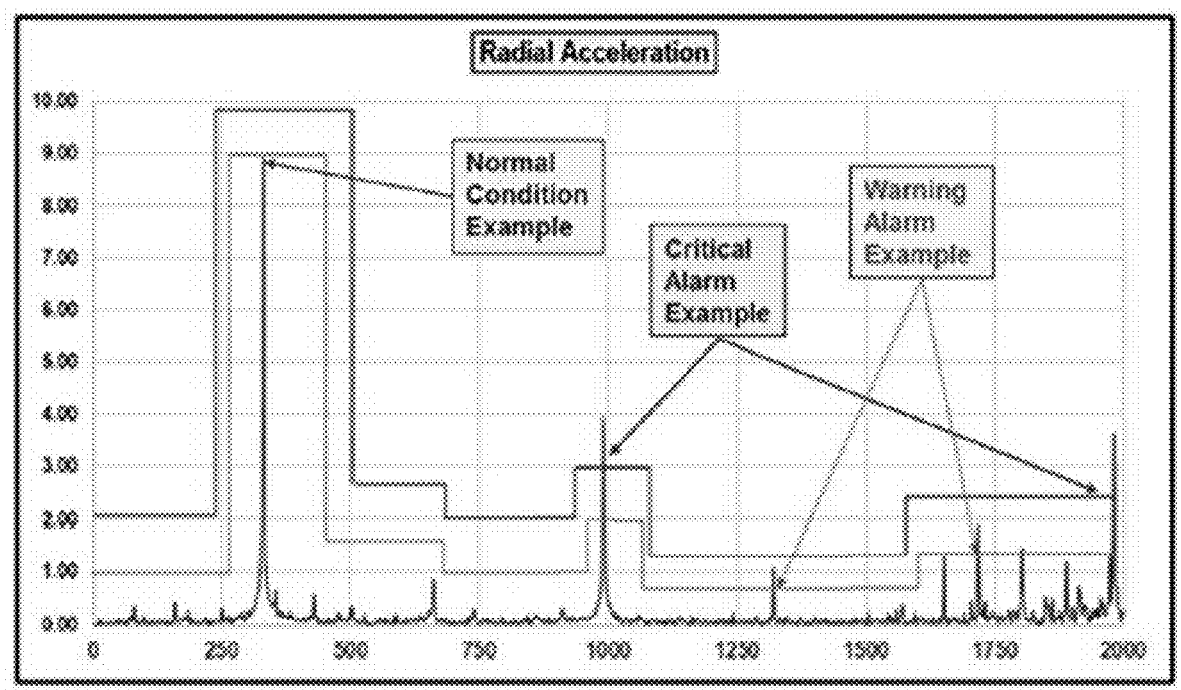

TRANSFER CONVEYOR SYSTEM FOR SEMICONDUCTOR INSPECTING APPARATUS USING MOVING MAGNET

CROSS-REFERENCE TO RELATED APPLICATION

This application claims priority to and the benefit of Korean Patent Application No. 10-2022-0002372, filed on Jan. 6, 2022, the disclosure of which is incorporated herein by reference in its entirety.

BACKGROUND

1. Field of the Invention

The present invention relates to a transfer conveyor system for a semiconductor inspecting apparatus using a moving magnet, and more specifically, to a transfer conveyor system for a semiconductor inspecting apparatus using a moving magnet which allows an abrasion degree, a damage state, or an alignment/misalignment of a carrier to be rapidly and easily detected so that a replacement time and rebalancing of the carrier are predictable and diagnosable.

2. Discussion of Related Art

Currently, methods of driving a linear direct-current motor (LDM) and a linear synchronous motor (LSM)-type linear motor used in industrial sites and factory systems are being adopted. In the methods, a transfer system using a permanent magnet as a stator and a coil as a mover (carrier including the stator and the mover) has been constructed. The transfer system may be applied to transport and logistics fields in which high-precision and high-speed characteristics can be utilized, in particular, transfer/transport systems for semiconductor inspecting apparatuses.

In order to implement control of such a linear motor, a commutation Hall sensor and an optical or magnetic linear scale are mounted on an armature mover to acquire speed and position information of the mover, or a position sensor such as an encoder or resolver is used for the mover to estimate a speed using an M-type measurement method, a T-type measurement method, or an M/T-type measurement method.

However, since a mover is operated by being equipped with a motor, a drive, a position sensor, and a communication Hall sensor, a high-precision and high-speed transfer cannot be implemented due to an increase in motor load. In addition, an encoder and a resolver are expensive to cause an increase in price of transfer equipment, and an optical position sensor has a large size and low durability and thus is difficult to install on transfer equipment.

In addition, due to the characteristics thereof, an object to be inspected is vulnerable to vibration, and position resolution is relatively high. Thus, in the existing transfer system, since it is impossible to detect a degree of vibration of a carrier and precise transfer position information in real time, a predictive diagnosis is difficult, which causes a reduction in inspection yield and an increase in product unit cost.

SUMMARY OF THE INVENTION

The present invention is directed to providing a transfer conveyor system for a semiconductor inspecting apparatus using a moving magnet, in which an armature including a moving magnet and a stator including a motor coil are provided to reduce a load of a carrier and thus implement a high-precision and high-speed transfer, an existing encoder and an existing resolver are removed to reduce costs and improve installation difficulties, and a degree of vibration of the carrier and precise transfer position information are detected in real time to facilitate a predictive diagnosis, thereby increasing inspection yield and reducing product unit costs.

According to an aspect of the present invention, there is provided a transfer conveyor system for a semiconductor inspecting apparatus using a moving magnet including a carrier in which a semiconductor wafer or a substrate is transferred by being mounted and accommodated, an armature which is provided to be accommodated in a permanent magnet plate under the carrier and includes a plurality of permanent magnets disposed in a longitudinal direction of the carrier, a stator which is disposed to be spaced apart from the armature, is fixedly installed on a guide rail, and includes a plurality of motor coils configured to interact with a magnetic field generated by the permanent magnet, a sensor unit which is installed at each of two ends of each motor coil, detects whether the armature approaches, senses a variation of the magnetic field, and measures a position of the armature from speed information of the armature, and a carrier monitoring unit which is provided on the carrier and monitors the carrier to detect an abrasion degree, a damage state, or an alignment/misalignment of the carrier in real time.

In the sensor unit, two Hall sensors may be disposed in a multi-layered stack structure.

The Hall sensors may be disposed at intervals of 90° to generate sine waves, a rising and falling period of a signal of the Hall sensor may be set as a speed measurement period to calculate a rotational speed of a motor, and the calculated rotational speed may be integrated to measure the position of the armature.

The carrier monitoring unit may include a speed sensor configured to measure a speed and acceleration, a pressure sensor configured to measure pressure, a temperature/humidity sensor configured to detect temperature/humidity of an outer surface of the carrier and temperature/humidity of the carrier, an inclination angle sensor configured to measure inclination, and a frequency detection sensor configured to detect revolutions per minute and a degree of vibration of the carrier from a measurement frequency measured in the carrier.

The carrier monitoring unit may be packaged in a single body, and long coupling holes may be formed in both end portions of the single body.

The carrier monitoring unit may further include an impact sensor configured to detect an impact transmitted to the carrier, and a noise sensor configured to detect noise from a natural frequency.

A parameter value of the measurement frequency may be any one of a root mean square (RMS) value, a peak value, and a fast Fourier transform (FFT) conversion value.

When a sensed parameter value of the measurement frequency exceeds a preset first threshold, the frequency detection sensor may output a warning alarm.

When the sensed parameter value of the measurement frequency exceeds a preset second threshold, the frequency detection sensor may stop an operation of the carrier.

BRIEF DESCRIPTION OF THE DRAWINGS

FIG. 3 shows diagrams illustrating a magnetic flux density of an armature being sensed through a Hall sensor in the transfer conveyor system for a semiconductor inspecting apparatus using a moving magnet according to one embodiment of the present invention.

FIG. 7 shows diagrams illustrating an example of a configuration for detecting a measurement frequency through the carrier monitoring unit of the transfer conveyor system for a semiconductor inspecting apparatus using a moving magnet according to one embodiment of the present invention.

DETAILED DESCRIPTION OF EXEMPLARY EMBODIMENTS

Hereinafter, one embodiment of a transfer conveyor system for a semiconductor inspecting apparatus using a moving magnet according to the present invention will be described in detail with reference to the accompanying drawings.

Figure 1:
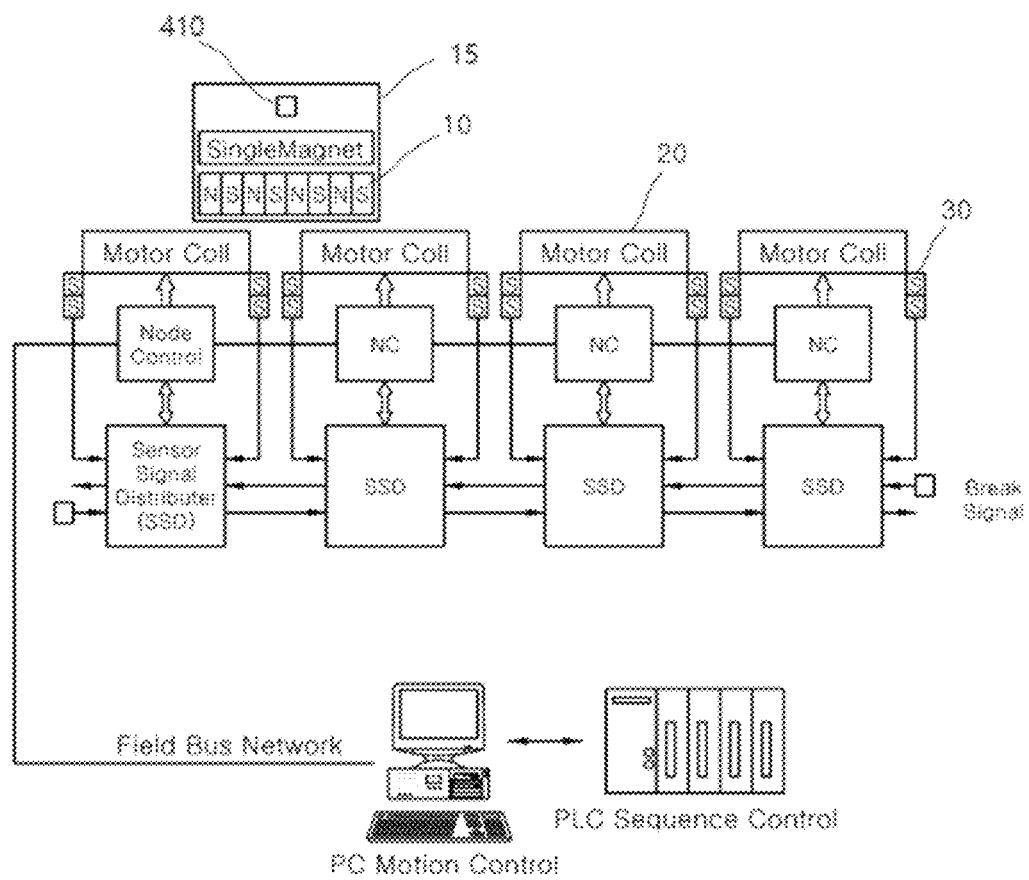
FIG. 1 is a block diagram of a transfer conveyor system for a semiconductor inspecting apparatus using a moving magnet according to one embodiment of the present invention.
Figure 2:
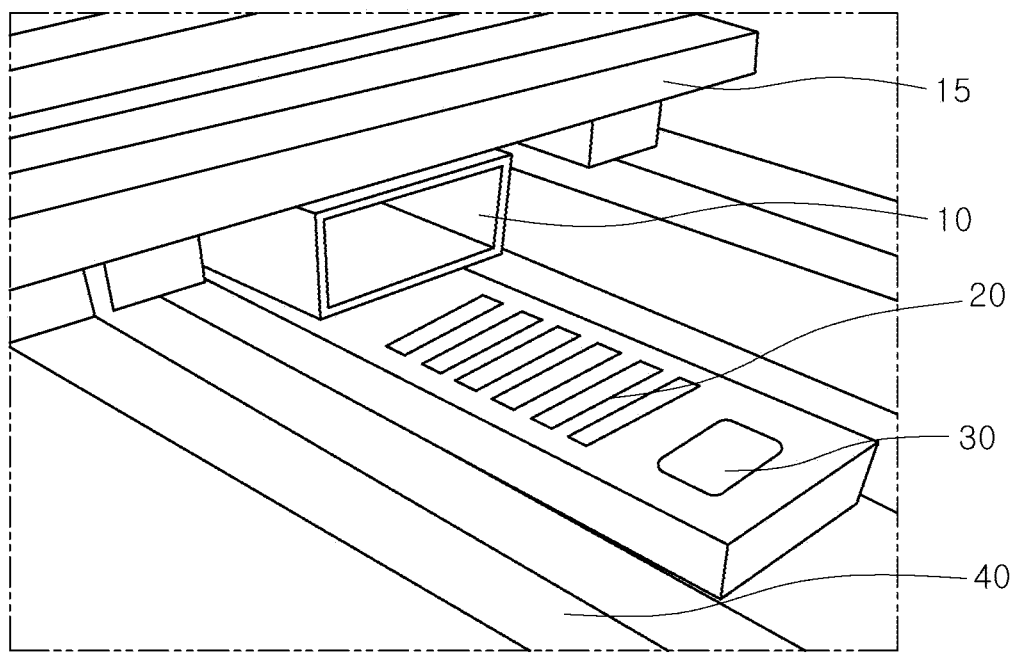
FIG. 2 is an image of the transfer conveyor system for a semiconductor inspecting apparatus using a moving magnet according to one embodiment of the present invention.
Figure 4:
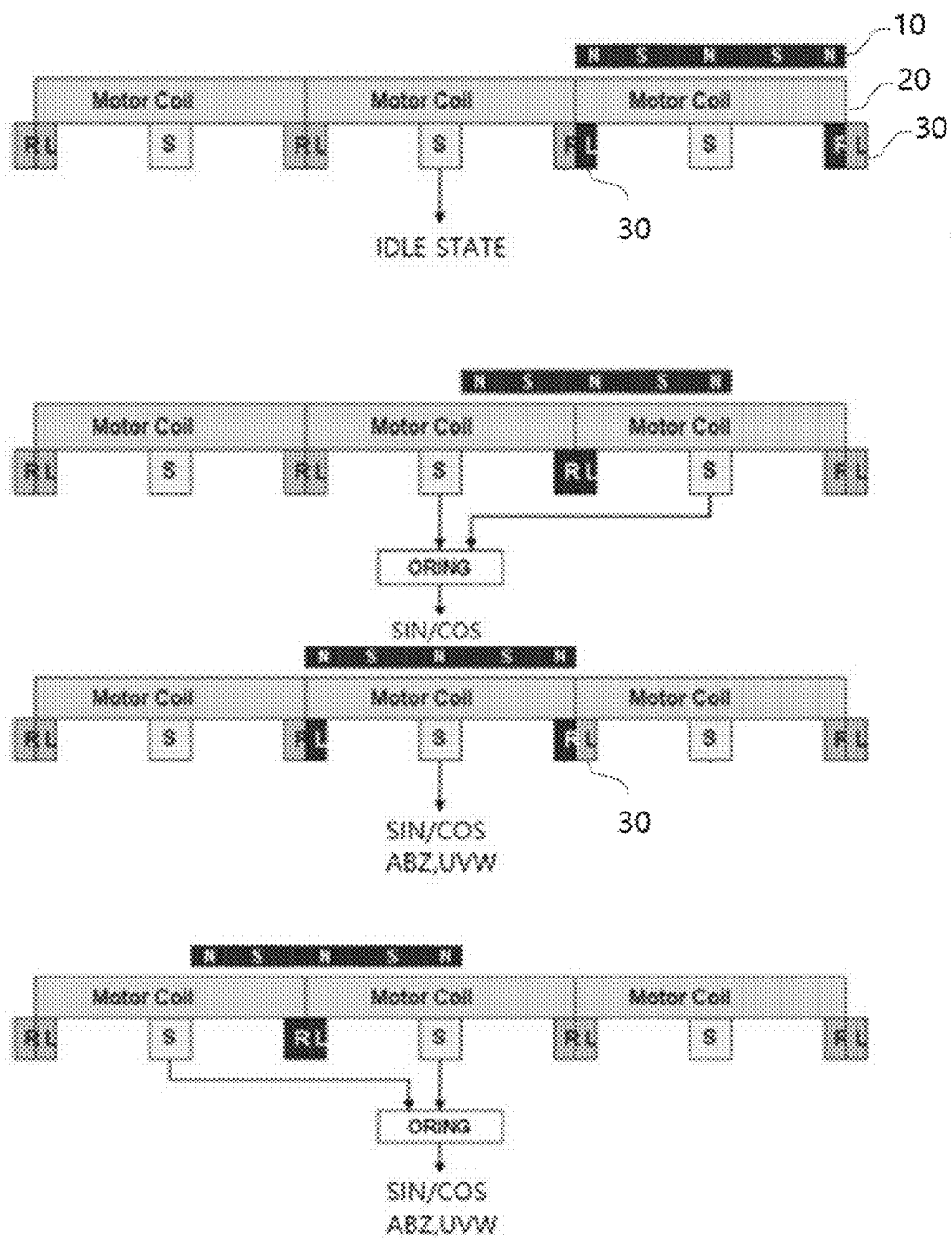
FIG. 4 shows diagrams illustrating an example of an operation method of the armature and a sensor signal in the transfer conveyor system for a semiconductor inspecting apparatus using a moving magnet according to one embodiment of the present invention.
Figure 5:
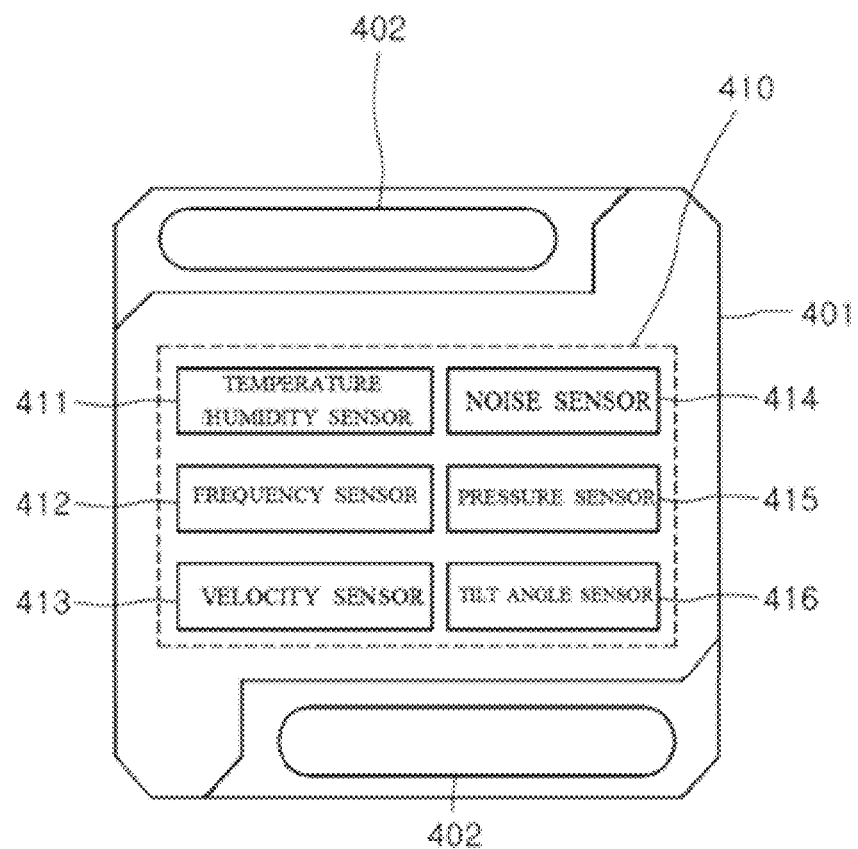
FIG. 5 is a front view of a carrier monitoring unit in the transfer conveyor system for a semiconductor inspecting apparatus using a moving magnet according to one embodiment of the present invention.

FIG. 1 is a block diagram of a transfer conveyor system for a semiconductor inspecting apparatus using a moving magnet according to one embodiment of the present invention. FIG. 2 is an image of the transfer conveyor system for a semiconductor inspecting apparatus using a moving magnet according to one embodiment of the present invention. FIG. 3 shows diagrams illustrating a magnetic flux density of an armature being sensed through a Hall sensor in the transfer conveyor system for a semiconductor inspecting apparatus using a moving magnet according to one embodiment of the present invention. FIG. 4 shows diagrams illustrating an example of an operation method of the armature and a sensor signal in the transfer conveyor system for a semiconductor inspecting apparatus using a moving magnet according to one embodiment of the present invention. FIG. 5 is a front view of a carrier monitoring unit in the transfer conveyor system for a semiconductor inspecting apparatus using a moving magnet according to one embodiment of the present invention.

As shown in FIGS. 1 to 5, the transfer conveyor system for a semiconductor inspecting apparatus using a moving magnet according to the present invention may include a carrier 15 in which a semiconductor wafer or a substrate is seated and accommodated and which is transferred, an armature 10 which is provided to be accommodated in a permanent magnet plate 11 under the carrier 15 and includes a plurality of permanent magnets disposed in a longitudinal direction of the carrier 15, a stator 20 which is disposed to be spaced apart from the armature 10, is fixedly installed on a guide rail 40, and includes a plurality of motor coils configured to interact with a magnetic field generated by the permanent magnet, a sensor unit which is installed at each of two ends of each motor coil, detects whether the armature 10 approaches, senses a variation of the magnetic field, and measures a position of the armature 10 from speed information of the armature, and a carrier monitoring unit 410 which is provided on the carrier 15 and monitors the carrier 15 to detect an abrasion degree, a damage state, or an alignment/misalignment of the carrier 15 in real time.

As mainly shown in FIGS. 1 and 2, the carrier 15 is a part in which the semiconductor wafer or the substrate is seated and accommodated and which is transferred. In addition, the carrier 15 may be applied in transferring substrates of a liquid crystal display (LCD), a flat panel display (FPD), and the like which are not semiconductor objects to be inspected.

The permanent magnet plate 11 may be coupled to a lower portion of the carrier 15.

The carrier 15 may be transferred by being guided by the guide rail 40.

The armature 10 may include the plurality of permanent magnets disposed in the longitudinal direction of the carrier 15.

The armature 10 may be provided to be accommodated in the permanent magnet plate 11.

The stator 20 may be disposed to be spaced apart from the armature 10. The stator 20 may be disposed to be spaced apart from the armature 10, may be fixedly installed on the guide rail 40, and may include the plurality of motor coils interacting with the magnetic field generated by the permanent magnet.

In addition, the transfer conveyor system may include a node controller, a sensor signal distributor (SSD) connected to the motor coil, and an upper controller connected to the node controller and the SSD.

As described above, when the armature 10 including a moving magnet and the stator 20 including the motor coil are provided, as compared with an existing linear synchronous motor (LSM)-type linear motor structure in which an armature including a coil is selected as a mover, it is possible to relatively reduce a weight, remove a power supply component including a drive connected to the motor coil, and remove a position sensor, a communication Hall sensor, and the like from the armature, thereby reducing a motor load. Accordingly, a load of the carrier 15 can be reduced to thus implement a high-precision and high-speed transfer.

On the other hand, an existing LSM structure is operated by being mounted with a position sensor, a communication Hall sensor, and the like, which has caused an increase in motor load.

Accordingly, in the present embodiment, as shown in FIG. 1, the sensor unit 30 may be installed at each of the two ends of each motor coil, may detect whether the armature 10 approaches, and may sense the variation of the magnetic field, and may measure the position of the armature 10 from the speed information of the armature.

The sensor unit 30 may include two Hall sensors at one of two ends of a coil.

The Hall sensors 30 may be disposed in a vertical stacking method. Such two Hall sensors 30 may be disposed at intervals of 90° to generate sine waves. A rising and falling period of a signal of each Hall sensor may be set as a speed measurement period to calculate a speed of the armature 10, and the calculated speed may be integrated to measure a position of the armature 10.

More specifically, by using the Hall sensors mounted on the stator 20, when the armature 10 moves, one Hall sensor may function as a proximity sensor (configured to detect whether the armature 10 approaches), and as shown in FIG. 3, the Hall sensor at a lower side may be used to sense a vector magnetic flux density of the permanent magnet. Then, when the armature 10 passes through the stator 20, sensor signals are added to detect a position of the armature 10.

When the armature 10 moves, as shown in FIG. 4, each armature (stator 20) may be informed of a position using a proximity sensor, and thus, a position signal and a U, V, W commutation signal may be generated.

Through the linear motor unit 300 having such a configuration, it is possible to reduce a defect rate due to dust in a clean environment and suppress vibration in a processing process as compared with a conventional ball screw transfer system and a conventional belt conveyor transfer system.

Meanwhile, due to the characteristics thereof, an object to be inspected is vulnerable to vibration, and position resolution is relatively high, and thus, in an existing transfer system, it has been impossible to detect a degree of vibration of the carrier 15 and precise transfer position information in real time.

Accordingly, in the present embodiment, the carrier monitoring unit 410 may be provided.

Mainly referring to FIG. 5, the carrier monitoring unit 410 may include a speed sensor 413 which measures a speed and acceleration, a pressure sensor 415 which measures pressure, a temperature/humidity sensor 411 which detects temperature/humidity of the carrier 15, an inclination angle sensor 416 which measures inclination, and a frequency detection sensor 412 which detects a degree of vibration of the carrier 15 from a measurement frequency measured in the carrier 15.

In addition, the carrier monitoring unit 410 may further include an impact sensor (not shown) which detects an impact transmitted to the carrier 15 and a noise sensor 414 which detects noise from a natural frequency.

The carrier monitoring unit 410 is packaged in a single body 401 as mainly shown in FIG. 5, and long coupling holes 402 may be formed in both end portions of the single body 401. The carrier monitoring unit 410 may be detachably attached to the carrier 15 using the long coupling holes 402.

The speed sensor 413 may provide notification of a minute displacement behavior of the carrier 15.

The pressure sensor 415 may monitor an intensity or the like of an external force applied to the carrier 15.

The temperature/humidity sensor 411 may provide temperature/humidity information about a transfer environment.

The inclination angle sensor 416 may measure inclination of the carrier 15. An abnormal behavior and a fault diagnosis of the carrier 15 may be predicted in advance.

The frequency detection sensor 412 serves to detect the degree of vibration of the carrier 15 from the measurement frequency measured by the carrier 15. Here, a parameter value of the measurement frequency may be any one of a root mean square (RMS) value, a peak value, and a fast Fourier transform (FFT) conversion value.

When a sensed parameter value of the measurement frequency exceeds a preset first threshold, the frequency detection sensor 412 may output a warning alarm signal. When the sensed parameter value of the measurement frequency exceeds a preset second threshold, the frequency detection sensor 412 may output a signal for stopping an operation of the carrier 15.

Accordingly, a degree of vibration and precise transfer position information of the carrier 15 can be detected in real time to facilitate a predictive diagnosis.

Figure 6:
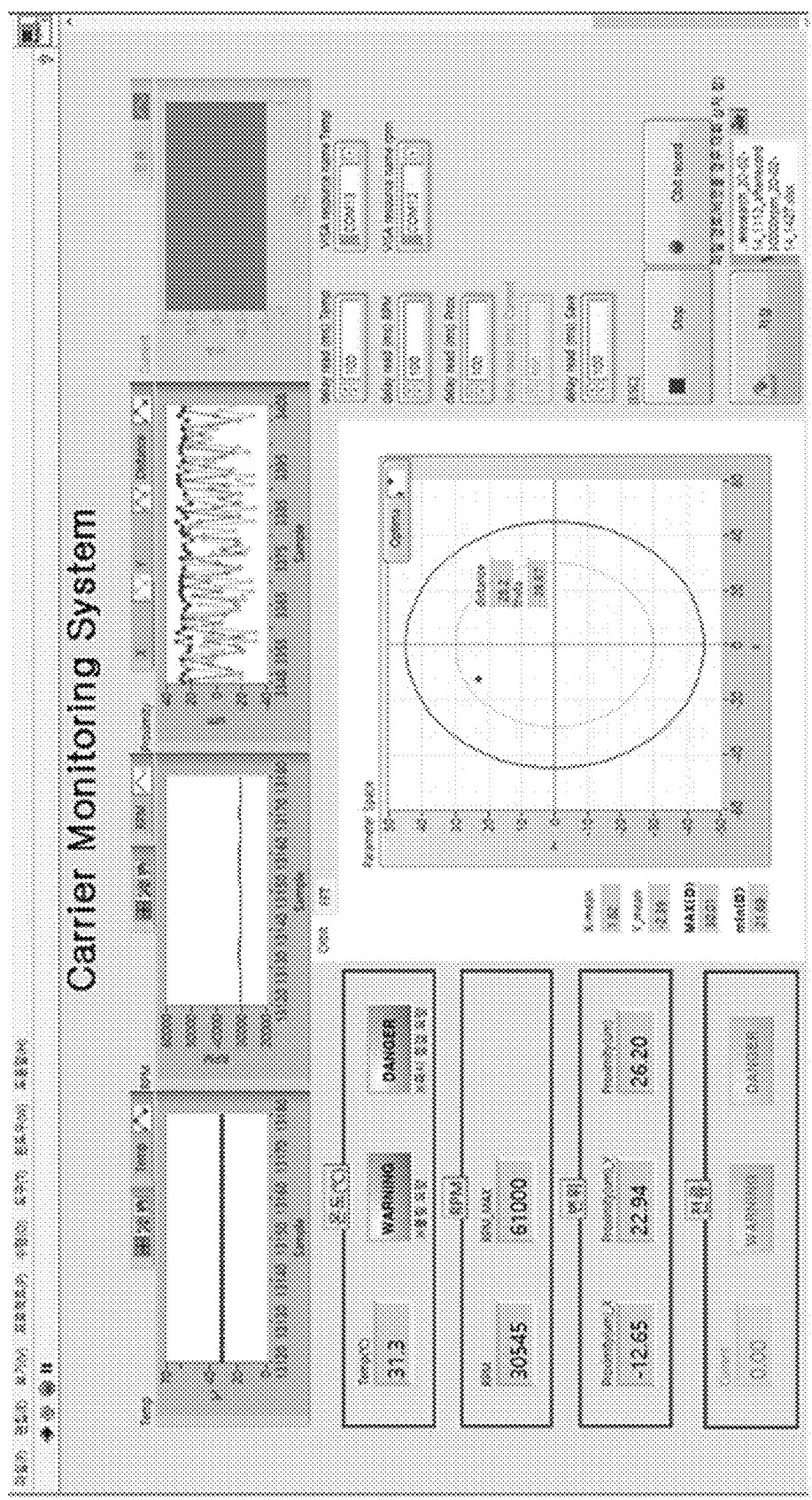
FIG. 6 is a diagram illustrating an example of a configuration for monitoring position information through the carrier monitoring unit of the transfer conveyor system for a semiconductor inspecting apparatus using a moving magnet according to one embodiment of the present invention.

FIG. 6 is a diagram illustrating an example of a configuration for monitoring position information through the carrier monitoring unit of the transfer conveyor system for a semiconductor inspecting apparatus using a moving magnet according to one embodiment of the present invention. FIG. 7 shows diagrams illustrating an example of a configuration for detecting a measurement frequency through the carrier monitoring unit of the transfer conveyor system for a semiconductor inspecting apparatus using a moving magnet according to one embodiment of the present invention.

As shown in FIG. 6, a monitoring user interface (UI) of the transfer conveyor system for a semiconductor inspecting apparatus using a moving magnet may be built. Temperature and humidity information of a system, driving revolutions per minute (RPM) of a linear motor, displacement, and the like may be detected on a screen in real time. For example, when a displacement amount deviates from a small circle, it indicates a warning alarm stage, and when a displacement amount deviates from a large circle, an operation stop signal may be output.

Mainly referring to FIG. 7, the frequency detection sensor 412 may sense vibration information of X-, Y-, and Z-axes according to a time. A natural frequency of the carrier 15 may be measured through the frequency detection sensor 412 to detect an RMS value of a measurement frequency of the carrier 15. In addition, a peak value of the measurement frequency may be used to monitor whether the carrier 15 is at a dangerous level or an immediate stop state.

In addition, an FFT conversion value of the measurement frequency may be used. As shown in FIG. 7, FFT may be performed on the measurement frequency to obtain an FFT conversion value, and the FFT conversion value may be monitored and compared with first and second thresholds preset for each specific band in real time to monitor an abnormal transfer state, thereby immediately stopping an operation.

The carrier monitoring unit 410 may be connected to a monitoring program through a separate gateway (not shown) provided for transmitting/receiving. Through the monitoring program, after an error is diagnosed from the sensed measurement frequency, a replacement time of the carrier 15 may be predicted and diagnosed, or the carrier 15 may be overhauled.

Through such configurations and operations, the armature 10 including a moving magnet and the stator 20 including the motor coil can be provided to reduce a load of the carrier 15 and thus implement a high-precision and high-speed transfer, an existing encoder and an existing resolver can be removed to reduce costs and improve installation difficulties, and a degree of vibration of the carrier 15 and precise transfer position information can be detected in real time to facilitate a predictive diagnosis, thereby increasing inspection yield and reducing product unit costs.

In addition, the carrier 15 is driven through a linear motor instead of a conventional rotary type drive actuator, thereby implementing higher precision and suppressing vibration during processing.

According to a transfer conveyor system for a semiconductor inspecting apparatus using a moving magnet according to the present invention, an armature including a moving magnet and a stator including a motor coil can be provided to reduce a load of a carrier and thus implement a high-precision and high-speed transfer, an existing encoder and an existing resolver can be removed to reduce costs and improve installation difficulties, and a degree of vibration of the carrier and precise transfer position information can be detected in real time to facilitate a predictive diagnosis, thereby increasing inspection yield and reducing product unit costs.

While the present invention has been described in detail using exemplary embodiments, the present invention is not limited to specific embodiments, and the present invention should be interpreted by the appended claims. It will be apparent to those skilled in the art that various modifications or alterations can be contrived and implemented within the scope described in the specification, and these modifications and alterations also fall within the technical scope of the present invention.

[Descriptions of Reference Numerals]

| | |
|---|---|
| 10: armature | 11: permanent magnet plate |
| 15: carrier | 20: stator |
| 30: sensor unit | 40: guide rail |
| 400: carrier monitoring unit | 401: single body |
| 402: long coupling hole | 410: carrier monitoring unit |
| 411: temperature/humidity sensor | 412: frequency detection sensor |
| 413: speed sensor | 414: noise sensor |
| 415: pressure sensor | 416: inclination angle sensor |

The invention claimed is:

1. A transfer conveyor system for a semiconductor inspecting apparatus using a moving magnet, comprising:
a carrier in which a semiconductor wafer or a substrate is seated and accommodated and which is transferred;
an armature which is provided to be accommodated in a permanent magnet plate under the carrier and includes a plurality of permanent magnets disposed in a longitudinal direction of the carrier;
a stator which is disposed to be spaced apart from the armature, is fixedly installed on a guide rail, and includes a plurality of motor coils configured to interact with a magnetic field generated by the permanent magnets of the armature;
a sensor unit which is installed at each of two ends of each motor coil, detects whether the armature approaches, senses a variation of the magnetic field, and measures a position of the armature from speed information of the armature; and
a carrier monitoring unit which is provided on the carrier and monitors the carrier to detect an abrasion degree, a damage state, or an alignment/misalignment of the carrier in real time,
wherein the carrier monitoring unit includes:
a speed sensor configured to measure a speed and acceleration;
a pressure sensor configured to measure pressure;
a temperature/humidity sensor configured to detect temperature/humidity of an outer surface of the carrier and temperature/humidity of the carrier;
an inclination angle sensor configured to measure inclination; and
a frequency detection sensor configured to detect a degree of vibration of the carrier from a measurement frequency measured in the carrier.

2. The transfer conveyor system of claim 1, wherein, in the sensor unit, two Hall sensors are disposed in a multi-layered stack structure.

3. The transfer conveyor system of claim 2, wherein the Hall sensors are disposed at intervals of 90° to generate sine waves;
a rising and falling period of a signal of the Hall sensor is set as a speed measurement period to calculate a rotational speed of a motor; and
the calculated rotational speed is integrated to measure the position of the armature.

4. The transfer conveyor system of claim 1, wherein the carrier monitoring unit is packaged in a single body; and
coupling holes are formed in both end portions of the single body.

5. The transfer conveyor system of claim 1, wherein the carrier monitoring unit further includes:
an impact sensor configured to detect an impact transmitted to the carrier; and
a noise sensor configured to detect noise from a natural frequency.

6. The transfer conveyor system of claim 1, wherein a parameter value of the measurement frequency is any one of a root mean square (RMS) value, a peak value, and a fast Fourier transform (FFT) conversion value.

7. The transfer conveyor system of claim 1, wherein, when a sensed parameter value of the measurement frequency exceeds a preset first threshold, the frequency detection sensor outputs a warning alarm.

8. The transfer conveyor system of claim 7, wherein, when the sensed parameter value of the measurement frequency exceeds a preset second threshold, the frequency detection sensor stops an operation of the carrier.

* * * * *